(12) United States Patent
Ryu et al.

(10) Patent No.: US 9,997,683 B2
(45) Date of Patent: Jun. 12, 2018

(54) LIGHT EMITTING DEVICE PACKAGE AND LIGHTING DEVICE HAVING THE SAME

(71) Applicant: LG INNOTEK CO., LTD., Seoul (KR)

(72) Inventors: Chung Hee Ryu, Seoul (KR); Bong Kul Min, Seoul (KR); Won Jin Son, Seoul (KR); Won Bong Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days. days.

(21) Appl. No.: 15/467,204

(22) Filed: Mar. 23, 2017

(65) Prior Publication Data

US 2017/0279015 A1 Sep. 28, 2017

(30) Foreign Application Priority Data

Mar. 25, 2016 (KR) .................. 10-2016-0036091
Mar. 25, 2016 (KR) .................. 10-2016-0036096
Mar. 25, 2016 (KR) .................. 10-2016-0036100

(51) Int. Cl.
*H01L 33/60* (2010.01)
*H01L 25/075* (2006.01)
*H01L 25/16* (2006.01)
*H01L 33/48* (2010.01)
*H01L 33/62* (2010.01)
(Continued)

(52) U.S. Cl.
CPC .......... *H01L 33/60* (2013.01); *H01L 25/0753* (2013.01); *H01L 25/167* (2013.01); *H01L 27/0248* (2013.01); *H01L 29/866* (2013.01); *H01L 33/486* (2013.01); *H01L 33/62* (2013.01); *H01L 33/647* (2013.01);
(Continued)

(58) Field of Classification Search
None
See application file for complete search history.

(56) References Cited

U.S. PATENT DOCUMENTS 8,174,189 B2 * 5/2012 Kim .................... H01L 25/0753
257/40
9,373,607 B2 * 6/2016 Han .................... H01L 25/0753
(Continued)

FOREIGN PATENT DOCUMENTS

| JP | 2011-204790 | 10/2011 |
| KR | 10-0591687 | 6/2006 |
| KR | 20-2009-0005346 | 6/2009 |

OTHER PUBLICATIONS

European Search Report dated May 9, 2017 issued in Application No. 17162253.3.
(Continued)

*Primary Examiner* — Benjamin Sandvik
(74) *Attorney, Agent, or Firm* — Ked & Associates, LLP

(57) ABSTRACT

A light emitting device package is provided. The light emitting device package may include a frame, a first lead frame spaced apart from the frame, a second lead frame spaced apart from the frame, a body coupled to the frame and the first and second lead frames and having a first cavity, and a plurality of light emitting devices on the frame exposed through the first cavity. The body may include a reflective part provided inside the first cavity to surround at least one of the light emitting devices, thereby improving light extraction efficiency.

22 Claims, 13 Drawing Sheets

(51) Int. Cl.
*H01L 27/02* (2006.01)
*H01L 29/866* (2006.01)
*H01L 33/64* (2010.01)

(52) U.S. Cl.
CPC .. *H01L 33/642* (2013.01); *H01L 2224/48091* (2013.01); *H01L 2224/48137* (2013.01)

(56) References Cited

U.S. PATENT DOCUMENTS

| | | | |
|---|---|---|---|
| 2004/0056265 A1* | 3/2004 | Arndt | H01L 25/0753 257/98 |
| 2007/0075325 A1 | 4/2007 | Beck et al. | |
| 2007/0228392 A1 | 10/2007 | Plank et al. | |
| 2011/0309404 A1 | 12/2011 | Lee | |
| 2013/0087817 A1* | 4/2013 | An | H01L 33/486 257/89 |
| 2013/0258658 A1 | 10/2013 | Hussell et al. | |
| 2014/0159098 A1* | 6/2014 | Chen | H01L 33/62 257/99 |
| 2014/0225134 A1* | 8/2014 | Min | H01L 25/0753 257/88 |
| 2015/0021633 A1 | 1/2015 | Yu | |

OTHER PUBLICATIONS

European Search Report dated Aug. 25, 2017 issued in Application No. 17162253.3.

* cited by examiner

LIGHT EMITTING DEVICE PACKAGE AND LIGHTING DEVICE HAVING THE SAME

CROSS-REFERENCE TO RELATED APPLICATIONS

This application claims priority Under 35 U.S.C. 119 to Korean Patent Application No. 10-2016-0036091 filed on Mar. 25, 2016, Korean Patent Application No. 10-2016-0036096 filed on Mar. 25, 2016 and Korean Patent Application No. 10-2016-0036100 filed on Mar. 25, 2016, whose entire disclosures are incorporated herein by reference.

BACKGROUND

1. Field

Embodiments relate to a light emitting device package and a lighting device having a light emitting device package.

2. Background

A light emitting device may include a light emitting diode with a P-N junction diode having a characteristic of converting electrical energy into light energy. The light emitting device may be fabricated with compound semiconductors belonging to group III and V on the periodic table. The light-emitting device can produce various colors by adjusting the compositional ratio of the compound semiconductors.

When forward voltage is applied to the light emitting device, electrons of an N layer are combined with holes of a P layer, so that energy corresponding to an energy gap between a conduction band and a valance band may be generated. The energy is mainly generated in the form of heat or light. In the light emitting device, the energy is generated in the form of light.

For example, a nitride semiconductor may have superior thermal stability and wide bandgap energy, and nitride semiconductors have been spotlighted in the field of optical devices and high-power electronic devices. Blue light emitting devices, green light emitting devices, ultraviolet (UV) light emitting devices, and the like using nitride semiconductors are commercialized and widely used. As the brightness of a light emitting diode has been significantly improved, the light emitting diode has been applied to various devices, such as, e.g., a backlight unit of a liquid crystal display, an electric signboard, an indicator, and a home appliance.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
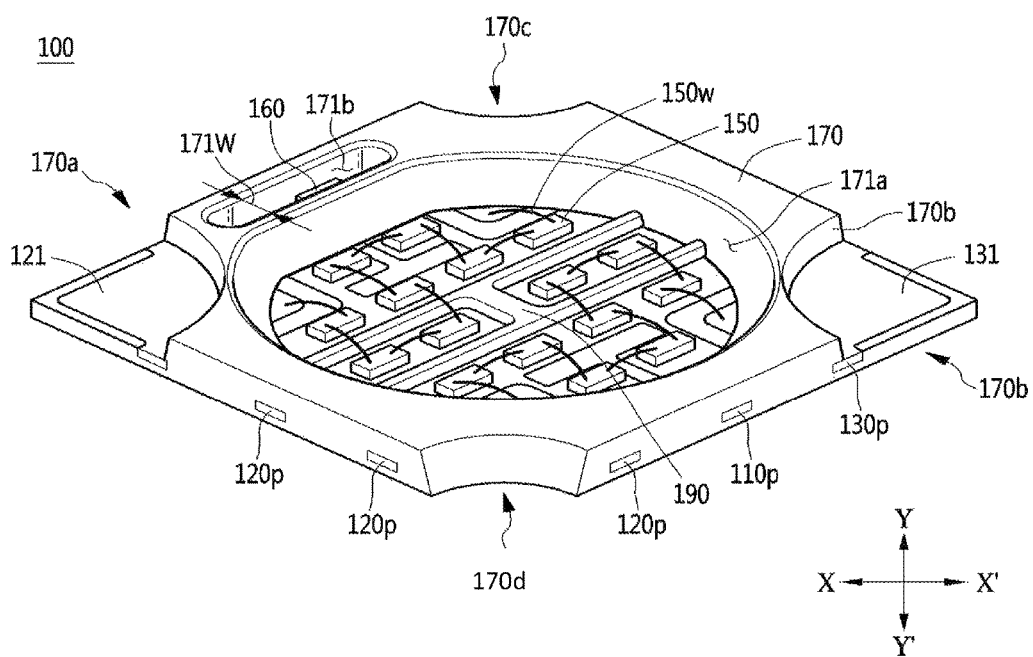
FIG. 1 is a perspective view showing a light emitting device package according to an embodiment.
Figure 2:
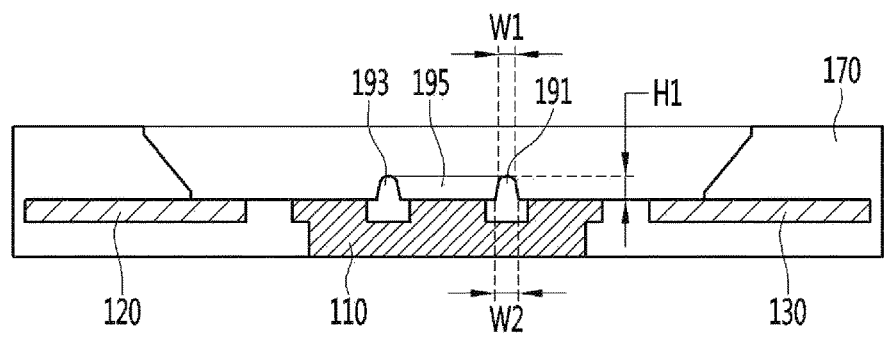
FIG. 2 is a sectional view showing a light emitting device package according to the embodiment.
Figure 3:
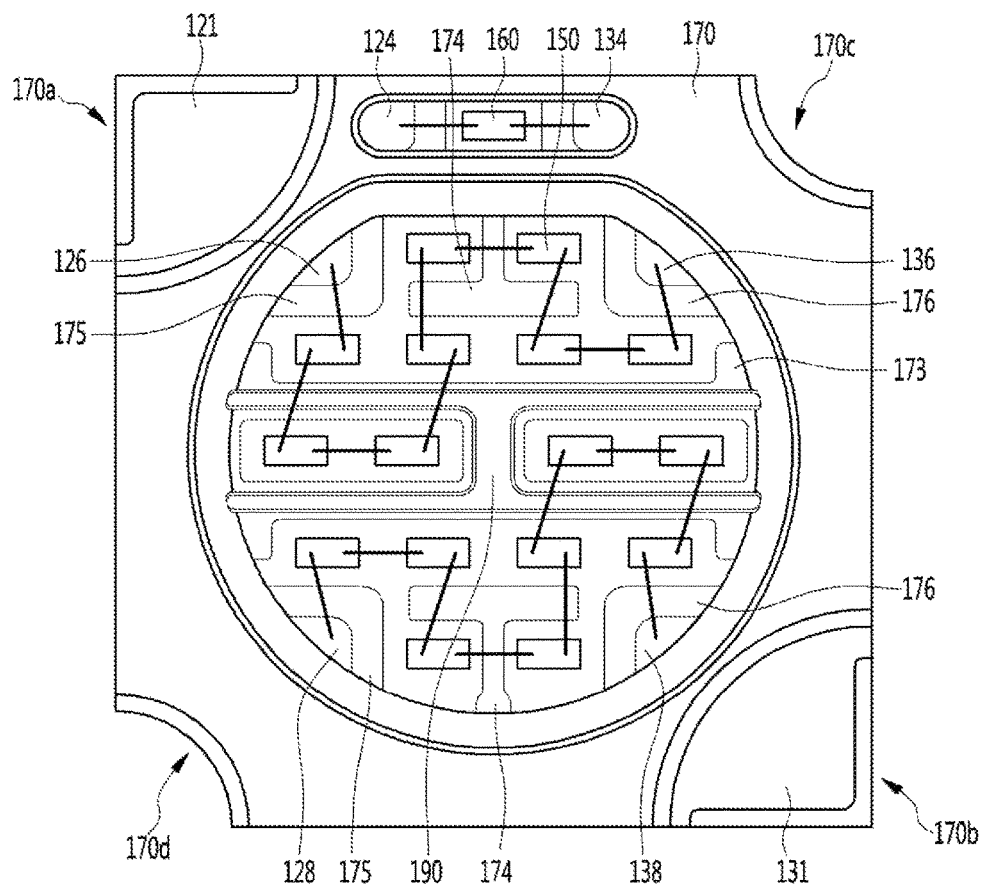
FIG. 3 is a plan view showing a light emitting device package according to the embodiment.
Figure 4:
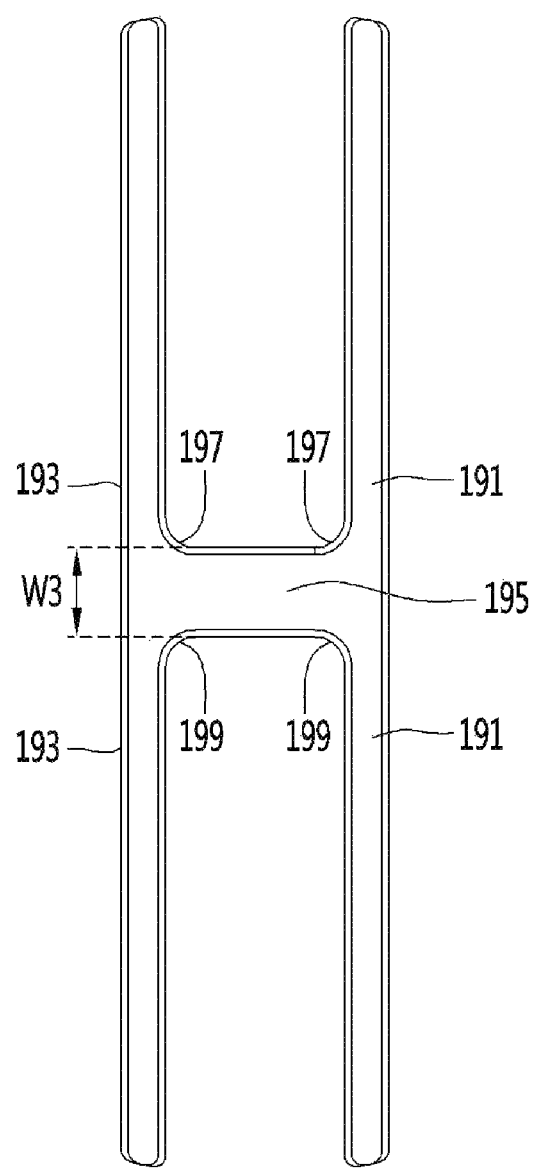
FIG. 4 is a plan view showing a reflective part according to an embodiment.
Figure 5:
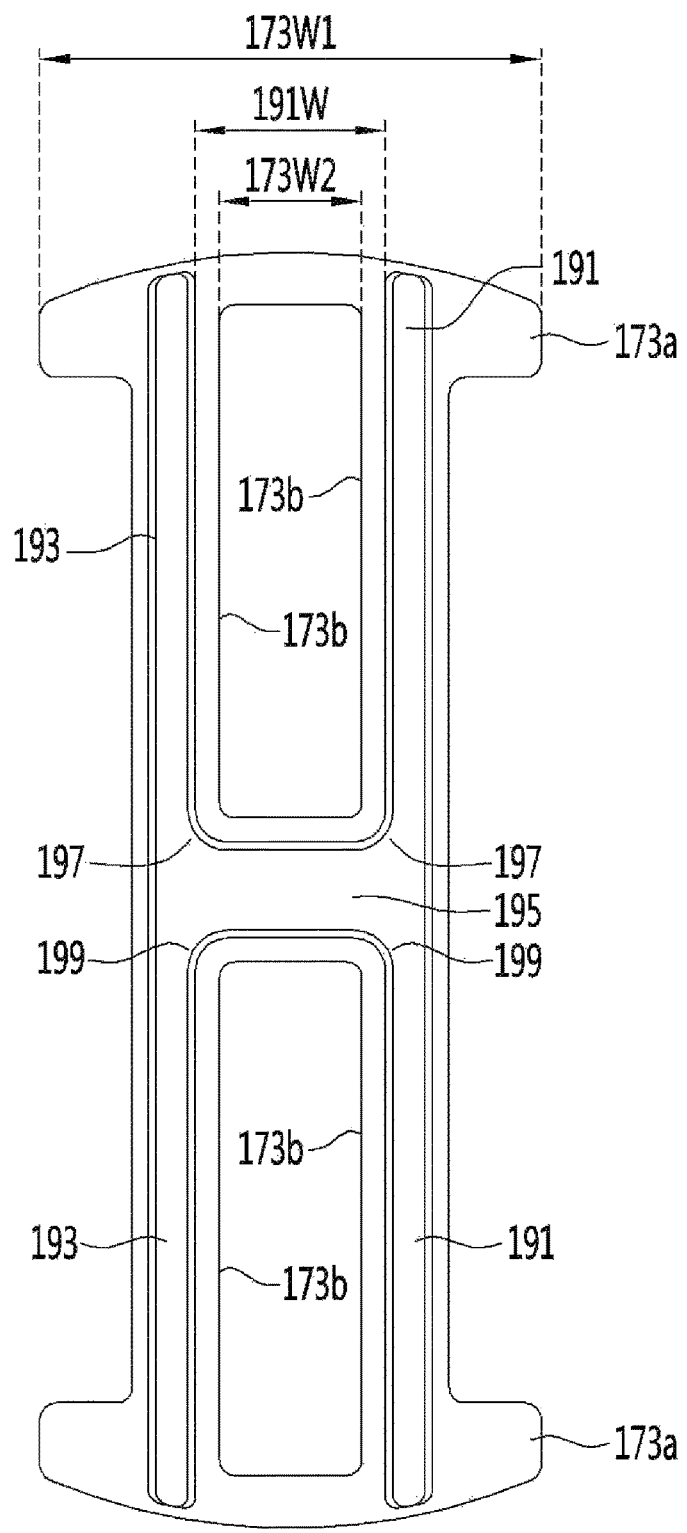
FIG. 5 is a plan view showing a reflective part and a first coupling part according to an embodiment.
Figure 6:
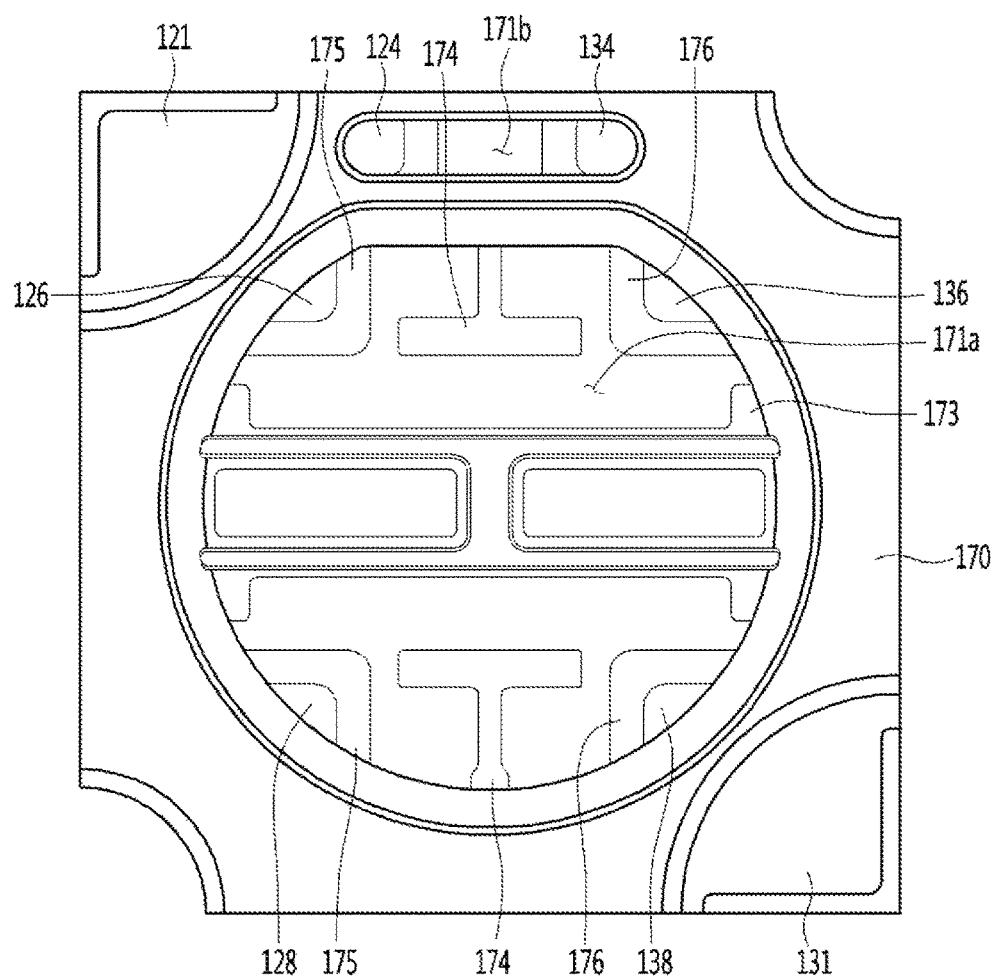
FIG. 6 is a plan view showing upper portions of a frame and first and second lead frames coupled to a body according to an embodiment.
Figure 6:
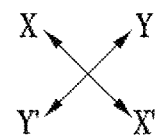
Figure 7:
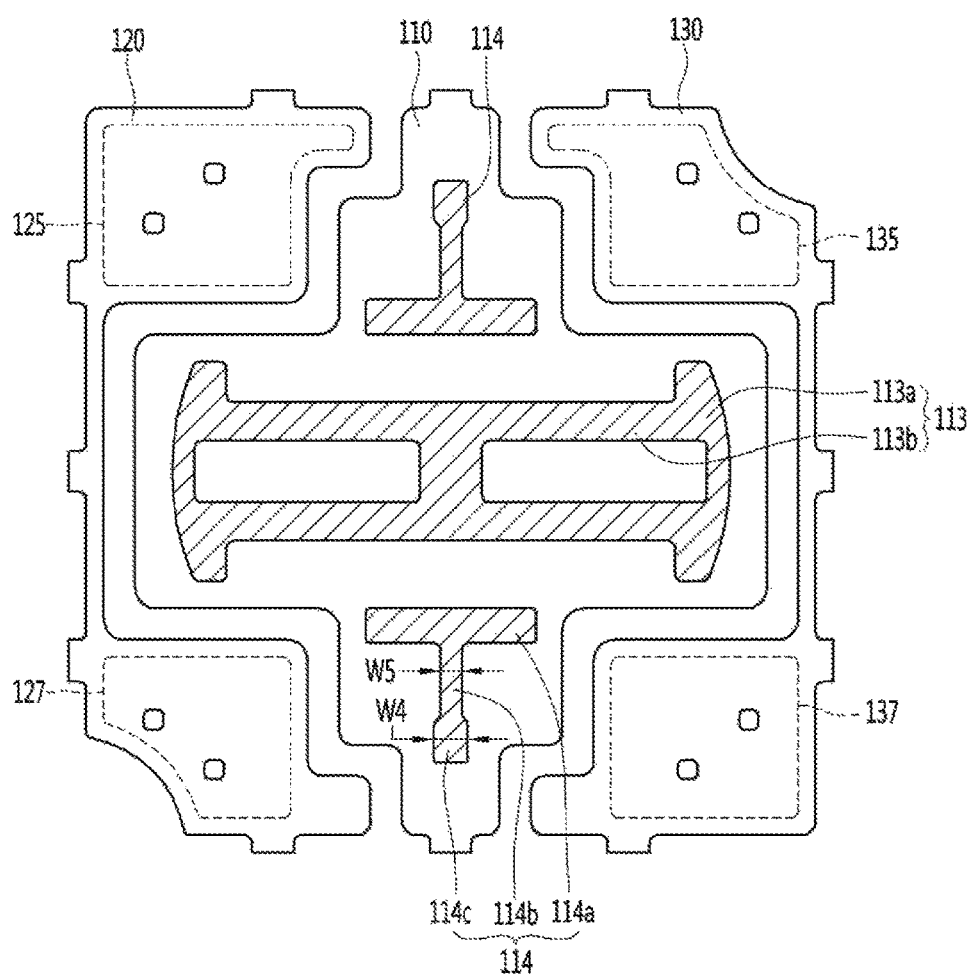
FIG. 7 is a plan view showing upper portions of a frame and first and second lead frames according to an embodiment.

A semiconductor device may include various electronic devices such as a light emitting device, a light receiving device, and the like. The light emitting device and the light receiving device may include a first conductive type semiconductor layer, an active layer, and a second conductive type semiconductor layer.

The semiconductor device may be the light emitting device. The light emitting device may emit light through the recombination between electrons and holes, and a wavelength of the light may be determined depending on the intrinsic energy band gap of the material. Accordingly, emitted light may be varied with the composition of the material.

As shown in FIG. 1 to FIG. 5, a light emitting device package 100 may include a frame (heat sinking plate) 110, a first lead frame 120, a second lead frame 130, a body 170, a protective device 160, and a plurality of light emitting devices 150. In the light emitting device package 100, the protective device 160 and the light emitting devices 150 may be mounted on the frame 110. The first and second lead frames 120 and 130 may be spaced apart from the frame 110 by a specific distance. The light emitting device package 100 may be a chip-on-board (COB) light emitting device package. For example, the light emitting device package 100 may be directly die-bonded onto a substrate and electrically connected with the substrate through a wire, but the embodiment is not limited thereto.

The body 170 may include at least one of a transmissive material, a reflective material, and an insulating material. The body 170 may include a material having a reflectance higher than transmittance with respect to light emitted from the light emitting devices 150. The body 170 may include a resin-based insulating material. For example, the body 170 may include at least one of a resin material, such as polyphthalamide (PPA), epoxy, or a silicone material, silicon (Si), a metallic material, photo sensitive glass (PSG), sapphire ($Al_2O_3$), and a printed circuit board (PCB). The body 170 may include four corners.

The body 170 may include first and second corners 170*a* and 170*b* facing each other in a first direction X-X' and third and fourth corners 170*c* and 170*d* facing each other in a second direction Y-Y' perpendicular to the first direction X-X'. A first pad 121 of the first lead frame 120 may be exposed through the first corner 170a. A second pad 131 of the second lead frame 130 may be exposed through the second corner 170b. The first and second corners 170a and 170b may expose top surfaces of the first and second pads 121 and 131.

End portions of the first and second corners 170a and 170b may cover edges of the first and second pads 121 and 131, respectively. For example, the end portions of the first and second corners 170a and 170b may be provided outward from the first and second pads 121 and 131, respectively. The third and fourth corners 170c and 170d may be engaged with screws when the substrate is coupled to the light emitting device package 100. The third and fourth corners 170c and 170d may be formed in curved structures such that the screws may be coupled to the third and fourth corners 170c and 170d, but the embodiment is not limited thereto. For example, the third and fourth corners 170c and 170d may be formed in the curved structures having concave outer portions.

The body 170 may be coupled to the frame 110, and the first and second lead frames 120 and 130. The body 170 may include a first cavity 171a and a second cavity 171b which expose portions of top surfaces of the frame 110 and the first and second lead frames 120 and 130. The first cavity 171a may extend from the central area of the body 170. The first cavity 171a may be provided in an area on which the light emitting devices 150 are mounted. The first cavity 171a may have a circular shape when viewed from a top view, but the embodiment is not limited thereto. For example, the first cavity 171a may have an oval shape or at least three polygonal shapes when viewed from the top view. The second cavity 171b may be spaced from the first cavity 171a by a specific distance. The second cavity 171b may be adjacent to one lateral side of the body 170, and may be interposed between one lateral side of the body 170 and the first cavity 171a.

The second cavity 171b may be spaced apart from the lateral side of the body 170 by a specific distance. The distance between the second cavity 171b and the first cavity 171a may be 0.1 mm or more. The distance between the second cavity 171b and the lateral side of the body 170 may be 0.1 mm or more. As the distance between the lateral side of the body 170 and the second cavity 171b is 0.1 mm or more, and the distance between the first and second cavities 171a and 171b is 0.1 mm or more, reliability may be improved when the first and second cavities 171a and 171b are realized. For example, when the distance between the lateral side of the body 170 and the second cavity 171b or the distance between the first cavity 171 and the second cavity 171b is less than 0.1 mm, defects may be caused in an injection molding process of the first and second cavities 171a and 171b.

The second cavity 171b may be interposed between the first and third corners 170a and 170c, but the embodiment is not limited thereto. The second cavity 171b may be provided in an area on which the protective device 160 is mounted. The second cavity 171b may have a diameter less than that of the first cavity 171a. For example, the second cavity 171b may have a bottom surface area narrower than that of the first cavity 171a. The area of the second cavity 171b may be 10-25% of the area of the first cavity 171a. A narrower width 171W of the second cavity 171b may be 2%-6% of the entire width of the light emitting device package 100. When the narrower width 171W of the second cavity 171b is less than 2% of the entire width of the light emitting device package 100, the size of the protective device 160 may be limited so that the stability of the light emitting device package 100 may be degraded. When the narrower width 171W of the second cavity 171b exceeds 6% of the entire width of the light emitting device package 100, as the size of the light emitting device package 100 may be increased except for a light emitting area in which light is emitted, application of the light emitting device package 100 to various fields may be limited. For example, the narrower width 171W of the second cavity 171b may be in the range of 0.150 mm to 0.450 mm.

The body 170 may include four outer portions, each of which may be provided between two adjacent corners among the first to fourth corners 171a to 17d. The four outer portions may be flat planes. A portion of the frame 110 and portions of the first and second lead frames 120 and 130 may be exposed through the outer portions. For example, first protrusion parts 110p may extend from the frame 110 through an outer portion of the body 170. The first protrusion parts 110p may be formed in a unit package cutting process after the injection-molding process of the body 170 is performed. The first protrusion parts 110p may be engagement parts which engage adjacent frames with each other before the unit package cutting process is performed.

Second protrusion parts 120p may be provided at the outer portions of the body 170 while extending from the first lead frame 120. The second protrusion parts 120p may be formed in a unit package cutting process after the injection-molding process of the body 170 is performed. The second protrusion parts 120p may be engagement parts which engage adjacent first lead frames to each other before the unit package cutting process is performed.

Third protrusion parts 130p may be provided at the outer portions of the body 170 while extending from the second lead frame 130. The third protrusion parts 130p may be formed in a unit package cutting process after the injection-molding process of the body 170 is performed. The third protrusion parts 130p may be connection parts which connect adjacent second lead frames with each other before the unit package cutting process is performed.

The body 170 may include first and second spacers 175 and 176. The first spacer 175 may be interposed between the frame 110 and the first lead frame 120. The second spacer 176 may be interposed between the frame 110 and the second lead frame 130.

Figure 8:
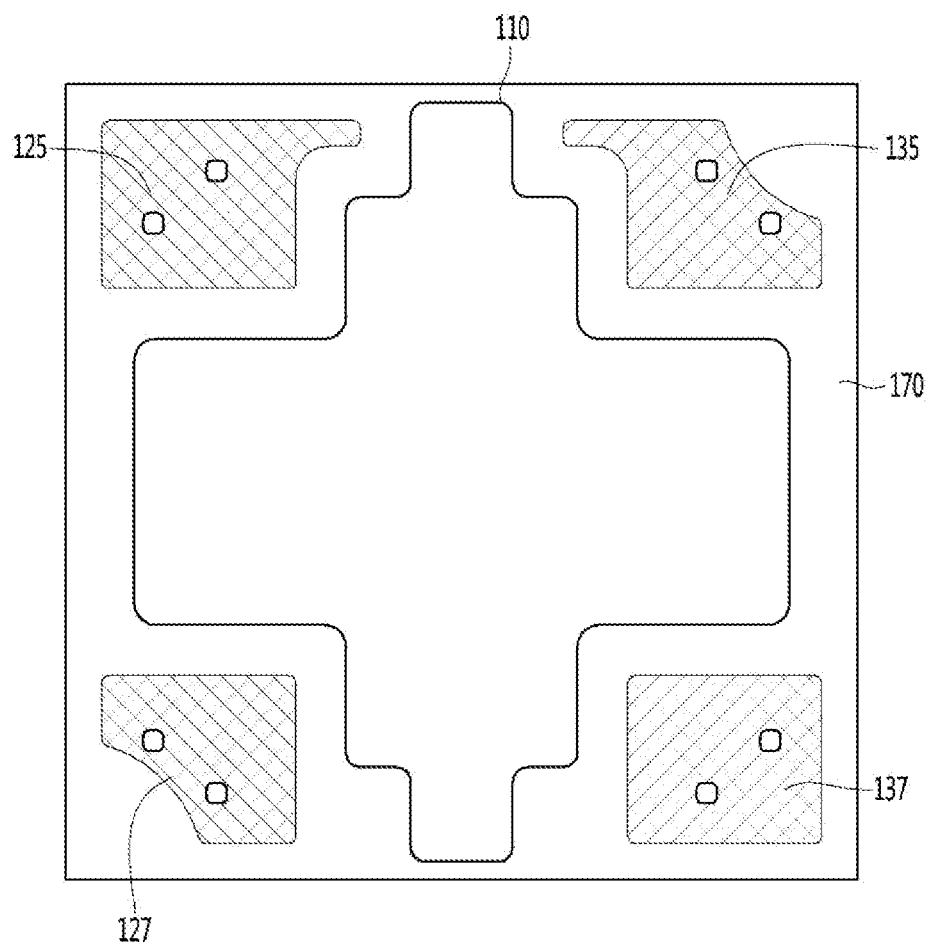
FIG. 8 is a plan view showing lower portions of a frame and first and second lead frames coupled to the body according to an embodiment.
Figure 9:
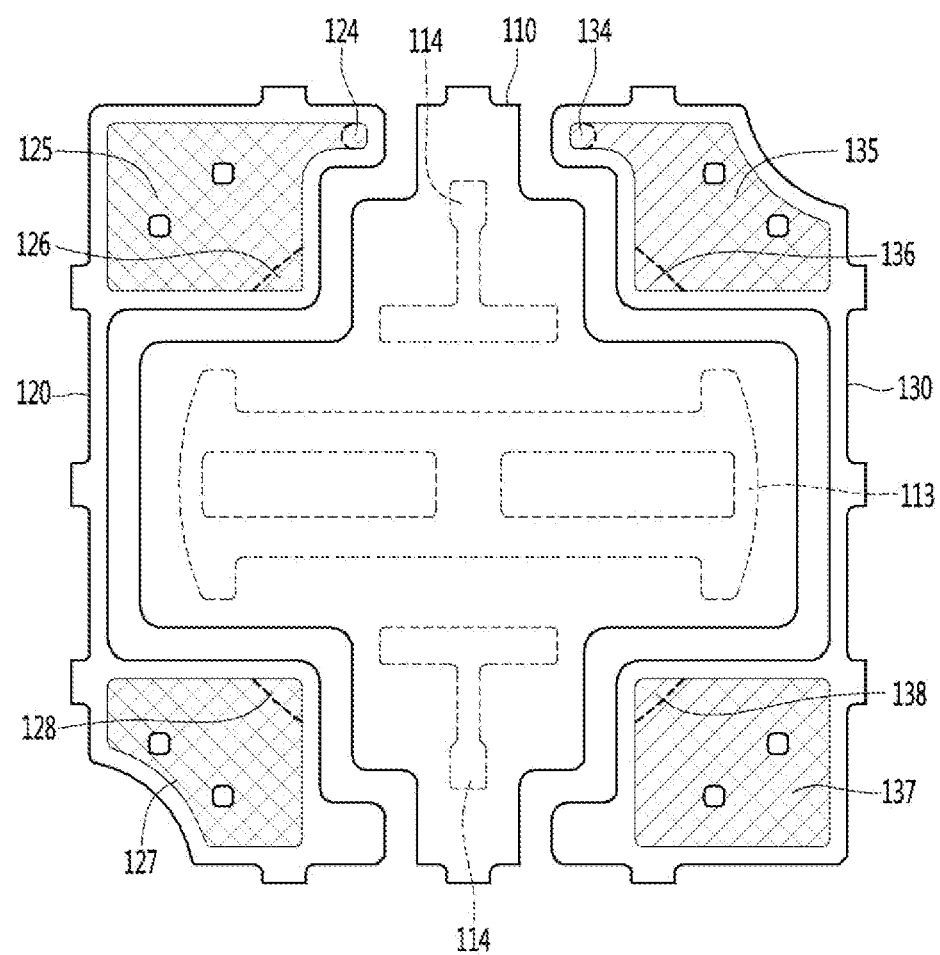
FIG. 9 is a plan view showing lower portions of a frame and first and second lead frames according to an embodiment.

The body 170 may include first and second coupling parts 173 and 174. The first and second coupling parts 173 and 174 may be provided on the frame 110. The first and second coupling parts 173 and 174 may increase the contact area between the body 170 and the frame 110. The first and second coupling parts 173 and 174 may improve coupling force between the body 170 and the frame 110. The first and second coupling parts 173 and 174 may be provided on the top surface of the frame 110 on which the light emitting devices 150 are mounted. The first and second coupling parts 173 and 174 may be provided on a stepped part provided on the top surface of the frame 110. The stepped part may be a groove structure provided in the top surface of the frame 110 and having a concave shape. The stepped part is described in detail with reference to FIG. 8 and FIG. 9. The first and second coupling parts 173 and 174 may include top surfaces aligned in line with to the top surface of the frame 110.

The body 170 may include a reflective part 190 inside the first cavity 171a. The reflective part 190 may include first to third reflective partitions 191, 193, and 195. The first to third reflective partitions 191, 193, and 195 may be connected with the first coupling part 173 provided on the top surface of the frame 110. For example, the first to third reflective partitions 191, 193, and 195 may be provided on the first coupling part 173.

The first to third reflective partitions 191, 193, and 195 may be defined as parts protruding from a top surface of the first coupling part 173. The first to third reflective partitions 191, 193, and 195 may protrude upward from a bottom surface of the first cavity 171a. The first and second reflective partitions 191 and 193 may be connected with an inner surface of the first cavity 171a. The first and second reflective partitions 191 and 193 may directly make contact with the inner surface of the first cavity 171a. The first and second reflective partitions 191 and 193 may be spaced apart from each other by a specific distance. The first and second reflective partitions 191 and 193 may be provided in parallel to each other. The third reflective partition 195 may be interposed between the first and second reflective partitions 191 and 193. The third reflective partition 195 may be provided at intermediate points of the first and second reflective partitions 191 and 193, but the embodiment is not limited thereto. The reflective part 190 may be divided into two areas by the first to third reflective partitions 191, 193, and 195. Two light emitting devices may be provided in each of the two areas, but the embodiment is not limited thereto.

The first to third reflective partitions 191, 193, and 195 may have widths which gradually decrease upward. The first to third reflective partitions 191, 193, and 195 may include inclined lateral sides, but the embodiment is not limited thereto. For example, the first to third reflective partitions 191, 193, and 195 may include lateral sides formed in a curved structure. The first and second reflective partitions 191 and 193 may be defined as parts protruding upward from the top surface of the first coupling part 173.

The first and second reflective partitions 191 and 193 may include upper portions and lower portions making contact with the first coupling part 173. The upper portions of the first and second reflective partitions 191 and 193 may include a first width W1, and the lower portions of the first and second reflective partitions 191 and 193 may include a second width W2. The lower portions of the first and second reflective partitions 191 and 193 may be provided in parallel to the top surface of the first coupling part 173. The first width W1 of the first and second reflective partitions 191 and 193 may be less than the second width W2. The first width W1 may be in the range of 0.1 mm to 0.6 mm, and the second width W2 may be 0.2 mm or more. The second width W2 may be in the range of 0.2 mm to 0.9 mm. The lower portions of the first and second reflective partitions 191 and 193 may make contact with lateral sides of the light emitting devices 150 while being perpendicular to the lateral sides of the light emitting devices 150.

The lower portions of the first and second reflective partitions 191 and 193 may be boundary areas between the first coupling part 173 and the reflective part 190. The second width W2 of the first and second reflective partitions 191 and 193 may be less than a third width W3 of the third reflective partition 195. The third width W3 of the third reflective partition 195 may be equal to or greater than the second width W2 of the first and second reflective partitions 191 and 193. For example, the third width W3 of the third reflective partition 195 may be 2 to 10 times greater than the second width W2 of the first and second reflective partitions 191 and 193. The third width W3 of the third reflective partition 195 may be in the range of 0.4 mm to 2.0 mm.

When the third width W3 of the third reflective partition 195 is less than 0.4 mm, since the distance between adjacent light emitting devices 150 is increased, a reflective function may be degraded. When the third width W3 of the third reflective partition 195 exceeds 2.0 mm, a dark part or portion may be formed by the third reflective partition 195, and the inner space defined by the first to third reflective partitions 191, 193, and 195 may be limited when the light emitting devices 150 are arranged in the inner space.

The widths of the lower portions of the first to third reflective partitions 191, 193, and 195 may be less than that of the first coupling part 173. The first coupling part 173 may include first and second extension parts 173a and 173b. The first extension parts 173a may directly make contact with the inner surface of the first cavity 171a in the body 170. The first extension parts 173a may face each other on the inner surface of the first cavity 171a in the body 170. Second extension parts 173b may be interposed between the first extension parts 173a. The second extension parts 173b may be spaced apart from each other by a specific distance. The second extension parts 173b may be provided under the first and second reflective partitions 191 and 193. The second extension part 173b may be provided under the third reflective partition 195 and may have a width wider than that of the third reflective partition 195, but the embodiment is not limited thereto. The first and second extension parts 173a and 173b may overlap the reflective part 190.

A distance 173W1 between the first extension parts 173a may be 2 to 12 times greater than the second width W2. The width of each second extension part 173b may be 1.0 to 5 times greater than the second width W2. The width of the first extension part 173a may be in the range of 1.5 mm to 2.5 mm, and the width of each second extension part 173b may be in the range of 0.2 mm to 0.9 mm. The distance 173W1 between the first extension parts 173a may be greater than a distance 191W between the first and second reflective partitions 191 and 193. A distance 173W2 between the second extension parts 173b may be less than the distance 191W between the first and second reflective partitions 191 and 193. Since the width of the first and second extension parts 173a and 173b is greater than that of the reflective part 190, reliability of an injection-molding process may be improved when the reflective part 190 is fabricated.

The first to third reflective partitions 191, 193, and 195 may have a height H1 lower than that of the inner surface of the first cavity 171a, but the embodiment is not limited thereto. The height H1 of the first to third reflective partitions 191, 193, and 195 may be equal to or higher than those of the light emitting devices 150. The height H1 of the first to third reflective partitions 191, 193, and 195 may be equal to or lower than that of the inner surface of the first cavity 171a.

The reflective part 190 may include first and second curved parts 197 and 199 formed at areas in which the first and second reflective partitions 191 and 193 meet the third reflective partition 195. The first and second curve parts 197 and 199 may be provided at the areas where the first and second reflective partitions 191 and 193 meet the third reflective partition 195 and thus refract light, emitted from the light emitting devices 150, in various directions, thereby improving light extraction efficiency of the light emitting device package 100.

The light emitting devices 150 may be provided on the frame 110. The light emitting devices 150 may be provided on the frame 110 exposed from the body 170. The light emitting devices 150 may be parallel-connected with each other in the form of two groups. The light emitting devices 150 may be electrically connected with each other through a wire 150*w*. Although this embodiment may be limited to the configuration that the light emitting devices 150 are parallel-connected with each other in the form of two groups as described above, embodiments are not limited thereto.

For example, the light emitting devices 150 may be parallel-connected with each other in the form of multiple groups. The light emitting devices 150 may be electrically connected with the first and second lead frames 120 and 130. The light emitting devices 150 may be electrically connected with the first and second lead frames 120 and 130 through the wire 150*w*. A first group of light emitting devices 150 may be series-connected with each other through the wire 150*w* and thus may be connected with first to fourth connection parts 126, 128, 136, and 138 exposed in the first cavity 171*a*. The first and second connection parts 126 and 128 may be portions of the first lead frame 120. Top surfaces of the first and second connection parts 126 and 128 may be exposed from the body 170 within the first cavity 171*a*. The third and fourth connecting parts 136 and 138 may be portions of the second lead frame 130. Top surfaces of the third and fourth connection parts 136 and 138 may be exposed from the body 170 within the first cavity 171*a*. The first and second lead frames 120 and 130 may be included. The first lead frame 120 may include third and fourth stepped parts 125 and 127 and the second lead frame 130 may include fifth and sixth stepped parts 135 and 137.

The first connection part 126 may extend from the third stepped part 125. The second connection part 128 may extend from the fourth stepped part 127. The area of the first connection part 126 may be 3% to 10% of that of the third stepped part 125. The area of the second connection part 128 may be 3% to 10% of that of of the fourth step 127. When the area of the first connection part 126 is less than 3% of that of the third stepped part 125, a minimum area for bonding of the wire 150*w* may not be ensured, and bonding reliability may be degraded. When the area of the second connection part 128 is less than 3% of the area of the fourth stepped part 127, a minimum area for bonding of the wire 150*w* may not be secured, and bonding reliability may be degraded. When the area of the first connection part 126 exceeds 10% of the area of the third stepped part 125, arrangement areas of the light emitting devices 150 may be reduced, and thus a degree of freedom may be reduced in the arrangement of the light emitting devices 150. When the area of the second connection part 128 exceeds 10% of the area of the fourth stepped part 127, arrangement areas of the light emitting devices 150 may be reduced, and thus a degree of freedom may be reduced in the arrangement of the light emitting devices 150.

The third connection part 136 may extend from the fifth stepped part 135. The fourth connection part 138 may extend from the sixth step 137. The area of the third connection part 136 may be 3% to 10% of the area of the fifth stepped part 135. The area of the fourth connection part 138 may be 3% to 10% of the area of the sixth stepped part 137. When the area of the third connection part 136 is less than 3% of the area of the fifth stepped part 135, a minimum area for bonding of the wire 150*w* may not be ensured, and bonding reliability may be degraded. When the area of the fourth connection part 138 is less than 3% of the area of the sixth stepped part 137, a minimum area for bonding of the wire 150*w* may not be ensured, and bonding reliability may be degraded. When the area of the third connection part 136 exceeds 10% of the area of the fifth stepped part 135, arrangement areas of the light emitting devices 150 may be reduced, and a degree of freedom may be reduced in the arrangement of the light emitting devices 150. When the area of the fourth connection part 138 exceeds 10% of the area of the sixth step part 137, arrangement areas of the light emitting devices 150 may be reduced, and a degree of freedom may be reduced in the arrangement of the light emitting devices 150.

The width between the first connection part 126 and the inner surface of the first cavity 171*a* may be in the range of 30 μm to 100 μm. The width between the second connecting part 128 and the inner surface of the first cavity 171*a* may be in the range of 30 μm to 100 μm. The width between the third connection part 136 and the inner surface of the first cavity 171*a* may be in the range of 30 μm to 100 μm. The width between the fourth connection part 138 and the inner surface of the first cavity 171*a* may be in the range of 30 μm to 100 μm. When the width between each of the first to fourth connection parts 126, 128, 136, and 138 and the inner surface of the first cavity 171*a* is less than 30 μμm, the minimum area for the bonding of the wire 150*w* may not be ensured, and thus the bonding reliability can be degraded. When the width between each of the first to fourth connection parts 126, 128, 136, and 138 and the inner surface of the first cavity 171*a* exceeds 100 μm, arrangement areas of the light emitting devices 150 may be reduced, and thus a degree of freedom may be reduced in the arrangement of the light emitting devices 150. The areas and the widths of the first to fourth connection parts 126, 128, 136, and 138 may improve the bonding reliability and may increase the degree of freedom in the arrangement of the light emitting devices 150.

The protective device 160 may be provided on the frame 110. The protection element 160 may be provided on the top surface of the frame 110 exposed through the bottom of the second cavity 171*b*. The protective device 160 may be a zener diode, a thyristor, a transient voltage suppression (TVS), or the like, but the embodiment is not limited thereto. The protective device 160 may be a zener diode which protects the light emitting devices 150 from electrostatic discharge (ESD) for illustrative purposes in the following description. The protective device 160 may be connected with the first and second lead frames 120 and 130 through wires.

The protective device 160 may be connected with fifth and sixth connection parts 124 and 134 exposed within the second cavity 171*b*. The fifth connection part 124 may be a portion of the first lead frame 120. A top surface of the fifth connection part 124 may be exposed from the body 170 within the second cavity 171*b*. The sixth connection part 134 may be a portion of the second lead frame 130. The top surface of the sixth connection part 134 may be exposed from the body 170 within the second cavity 171*b*.

As shown in FIG. 1 to FIG. 5, the reflective part 190 may be included in the COB light emitting device package 100 to reflect light, emitted from the light emitting devices 150, to the outside, thereby improving light extraction efficiency.

Deformation of the light emitting device package 100 resulting from the contraction and the expansion of the light emitting device package 100 may be prevented by the reflective part 190 provided in the first cavity 171*a* in which the light emitting devices 150 are mounted. Deformation of a molding part resulting from the contraction and the expansion of the molding part provided in the first cavity 171*a* may be prevented by the reflective part 190 provided in the first cavity 171*a* in which the light emitting devices 150 are mounted. The deformation of the molding part may be prevented, and thus the wire 150*w* may be prevented from being damaged due to the deformation of the molding part.

As shown in FIG. 6 to FIG. 9, a light emitting device package may include the frame 110 exposed through the upper portion of the light emitting device package having the first and second cavities 171a and 171b provided therein. The frame 110 may include first and second stepped parts 113 and 114.

The first and second stepped parts 113 and 114 may be provided on the frame 110. The first and second stepped parts 113 and 114 may have a recess shape and may have a stepped structure when viewed as a cross-sectional view, but the embodiment is not limited thereto. The first and second stepped parts 113 and 114 may increase the contact area with the body 170 to improve the coupling force with the body 170. Further, the first and second stepped parts 113 and 114 may prevent external moisture from being permeated due to the stepped structure thereof.

The first and second stepped parts 113 and 114 may be formed by etching portions of a top surface of the frame 110, but embodiment is not limited thereto. Thicknesses of the first and second stepped parts 113 and 114 may be 50% of the thickness of the frame 110, but the embodiment is not limited thereto. For example, the thicknesses of the first and second stepped parts 113 and 114 may be 50% or more of the thickness of the frame 110. The first stepped part 113 may be provided while extending across the central area of the frame 110. The first stepped part 113 may entirely overlap the first coupling part 173 of the body 170 and may directly make contact with the first coupling part 173. The first stepped part 113 may include first and second grooves 113a and 113b.

First grooves 113a may be provided at both end portions of the first stepped part 113. The first grooves 113a may be symmetrical to each other. A portion of the first groove 113a may be provided inside the first cavity 171a and another portion of the first groove part 113a may make contact with the body 170 outside the first cavity 171a. The second grooves 113b may extend from the first grooves 113a. The second grooves 113b may be spaced apart from each other by a specific distance. The second grooves 113b may be provided in parallel to each other. The second grooves 113b may include connection structures to connect the second grooves 113b with each other, but the embodiment is not limited thereto. The frame 110 may be divided with two areas inward from the first stepped part 113, and a plurality of light emitting devices may be provided in the two areas.

The second stepped parts 114 may be spaced apart from the first stepped part 113 by a specific distance. The second stepped parts 114 may be symmetrical to each other about the first stepped part 113. The second stepped parts 114 may include first and second linear parts 114a and 114b. The first linear parts 114a may be provided in parallel with the second grooves 113b of the first stepped part 113. In this case, the light emitting devices may be interposed between the first linear parts 114a and the first stepped part 113. The second linear parts 114b may extend from the central regions of the first linear parts 114a. The second linear parts 114b may extend from the first linear parts 114a toward the outer portions of the frame 110. In this case, the light emitting devices may be provided at both sides of the second linear parts 114b. The second linear parts 114b may include end portions 114c making contact with the first cavity 171a. A portion of the end portion 114c may be provided inside the first cavity 171a and another portion of the end portion 114c may overlap the body 170 outside the first cavity 171a.

The end portion 114c may have a fourth width W4 and the second linear part 114b may have a fifth width W5. The fourth width W4 of the end portion 114c may be equal to or wider than the fifth width W5 of the second linear part 114b. According to the embodiment, the fourth width W4 of the end portion 114c extending from the body 170 may be equal to or wider than the fifth width W5 of the second linear part 114b, and the injection-molding process for the body 170 may reach even the edge area of the first linear part 114a. Reliability of the injection-molding process for the first linear part 114a, which may be provided farthest from the first cavity 171a, may be improved due to the end portion 114c having the fourth width W4 equal to or wider than the fifth width W5.

The fifth width W4 may be 50% to 100% of the fourth width W4. The fifth width W5 may be in the range of 0.2 mm to 0.9 mm. The fourth width W4 may be in the range of 0.1 mm to 0.9 mm. The first linear part 114a may have a width wider than the fifth width W5 of the second linear part 114b, but the embodiment is not limited thereto. For example, the first linear part 114a may be 50% to 100% of the fourth width W4, and may be in the range of 0.2 mm to 0.9 mm.

The frame 110 may be provided on the top surface thereof with the first and second stepped parts 113 and 114. The first and second stepped parts 113 and 114 may be coupled to the first and second coupling parts 173 and 173 of the body 170 to increase the contact area between the body 170 and the frame 110. Accordingly, a coupling force between the body 170 and the frame 110 may be improved. In addition, external moisture may be prevented from being permeated due to the stepped structures.

The third and fourth stepped parts 125 and 127 may be provided on a lower portion of the first lead frame 120. The third and fourth stepped parts 125 and 127 may have a recess shape and may have a stepped structure when viewed from a cross-sectional view, but the embodiment is not limited thereto. The third and fourth stepped parts 125 and 127 may be supported by a mold frame provided under the first lead frame 120 when the body 170 is subject to an injection-molding process, thereby preventing the first lead frame 120 from being deformed.

The third and fourth stepped parts 125 and 127 may prevent the first lead frame 120 from being deformed so that the first, second and fifth connection parts 126, 128 and 124 may be formed. Portions of the third and fourth stepped parts 125 and 127 may overlap the first, second and fifth connection parts 126, 128 and 124. The third and fourth stepped parts 125 and 127 may expose the first, second and fifth connection parts 126, 128 and 124 from the body 170 within the first and second cavities 171a and 171b. The third stepped part 125 may overlap the first pad 121. The third stepped part 125 may expose the first pad 121 from the body 170. The third and fourth stepped parts 125 and 127 may prevent external moisture from being permeated by the stepped structure. The thicknesses of the third and fourth stepped parts 125 and 127 may be 50% of the thickness of the first lead frame 120, but the embodiment is not limited thereto. For example, the thicknesses of the third and fourth stepped parts 125 and 127 may be 50% or more of the thickness of the first lead frame 120.

The fifth and sixth stepped parts 135 and 137 may be provided under the second lead frame 130. The fifth and sixth stepped parts 135 and 137 may have a recess shape and may have a stepped structure, but the embodiment is not limited thereto. The fifth and sixth stepped parts 135 and 137 may be supported by a mold frame provided under the second lead frame 130 when the body 170 is subject to the injection-molding process, thereby preventing the second lead frame 130 from being deformed.

The fifth and sixth stepped parts 135 and 137 may prevent the second lead frame 130 from being deformed such that the third, fourth and sixth connection parts 136, 138 and 134 are formed. Portions of the fifth and sixth stepped parts 135 and 137 may overlap the third, fourth and sixth connection parts 136, 138 and 134. The fifth and sixth stepped parts 135 and 137 may expose the third, fourth, and sixth connection parts 136, 138, and 134 from the body 170 within the first and second cavities 171a and 171b. The sixth stepped part 137 may overlap the second pad 131. The sixth stepped part 137 may expose the second pad 131 from the body 170. The fifth and sixth stepped parts 135 and 137 may prevent external moisture from being permeated by the stepped structure. The thicknesses of the fifth and sixth stepped parts 135 and 137 may be 50% of the thickness of the second lead frame 130, but the embodiment is not limited thereto. For example, the thicknesses of the fifth and sixth stepped parts 135 and 137 may be 50% or more of the thickness of the second lead frame 130.

The third and fourth stepped parts 125 and 127 may be provided under the first lead frame 120, and the fifth and sixth stepped parts 125 and 127 may be provided under the second lead frame 130. The third to sixth stepped parts 125, 127, 135, and 137 may be supported by the mold frame when the injection-molding process is performed with respect to the body 170, thereby preventing the first and second lead frames 120 and 130 from being deformed. The first to sixth connection parts 126, 128, 136, 138, 124, and 134, and the first and second pads 121 and 131, which overlap the third to sixth stepped parts 125, 127, 135, and 137, are exposed from the body 170, thereby preventing manufacturing defects of the first to sixth connection parts 126, 128, 136, 138, 124, and 134, and the first and second pads 121 and 131. Further, mixture may be prevented from being permeated by the step structure of the third to sixth stepped parts 125, 127, 135, and 137.

Figure 10:
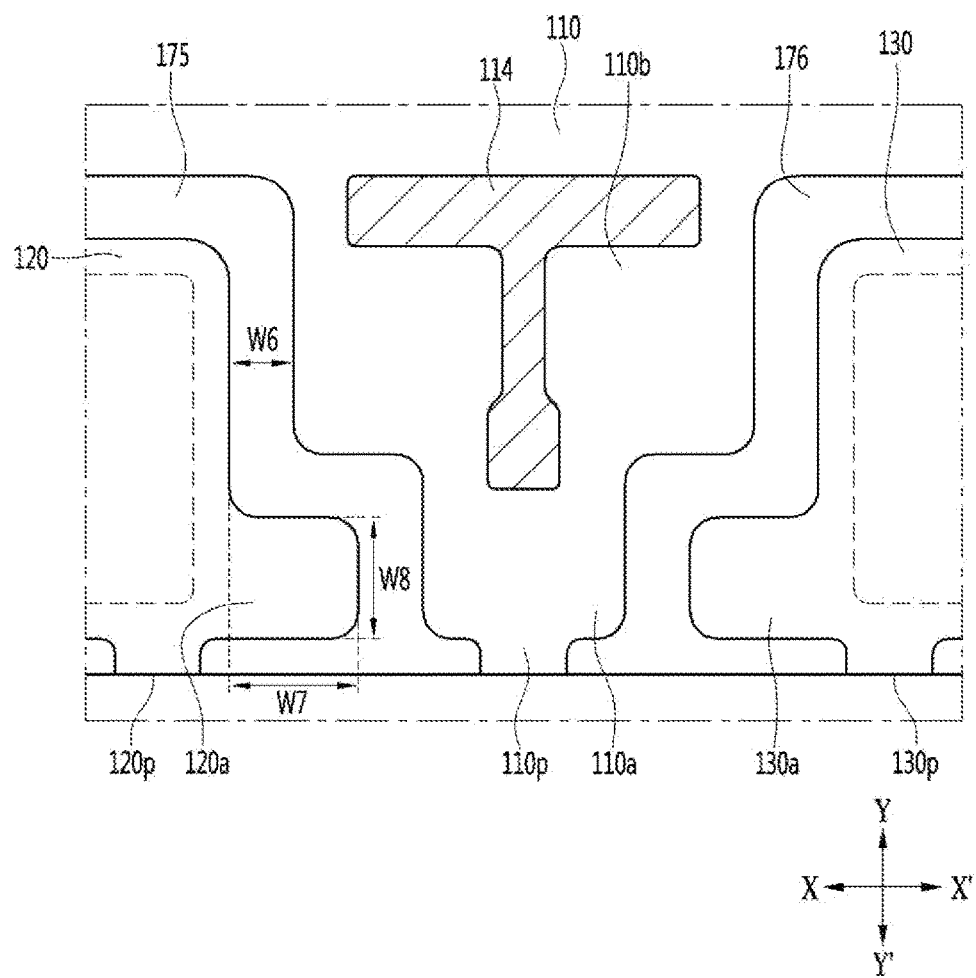
FIG. 10 is a view showing first and second spacers between the frame, and first and second lead frames according to an embodiment.

As shown in FIG. 10, the frame 110, and the first and second lead frames 120 and 130 may be included. A first spacer 175 may be interposed between the frame 110 and the first lead frame 120, and a second spacer 176 may be interposed between the frame 110 and the second lead frame 130. The first spacer 175 may have a sixth width W6. The sixth width W6 of the first spacer 175 may be a distance between the frame 110 and the first lead frame 120. The first spacer 175 may extend to the outer portion of the light emitting device package. A width of the second spacers 176 may be a distance between the frame 110 and the second lead frame 130. The first spacer 175 may be symmetrical to the second spacer 176 and may have the overall uniform width, but the embodiment is not limited thereto.

The frame 110, and the first and second lead frames 120 and 130 may include flexure or curved structures at edges of the light emitting device package. The curved structures may correspond to the structures of the first and second spacers 175 and 176. The coupling force between the body 170 and the first frame 110, the coupling force and between the body 170 and the first and second lead frames 120 and 130 may be improved, and the first and second spacers 175 and 176 may be prevented from being cracked due to external force.

The frame 110 may include the first protrusion parts 110p exposed through the outer portions of the light emitting device package. The frame 110 may include a mounting part 110b on which the light emitting devices may be mounted and a first curved part 110a extending from the mounting part 110b. The first curved part 110a may direct make contact with the first protrusion part 110p. The first curved part 110a may have a width greater than the protrusion part 110p.

The width of the protrusion part 110p may be 20% to 50% of the width of the first curved part 110a. When the width of the protruding part 110p is less than 20% of the width of the first curved part 110a, the strength between adjacent light emitting device packages may be reduced, and thus defects may be caused in a cutting process or the injection molding process of the body 170. When the width of the protrusion part 110p exceeds 50% of the width of the first curved part 110a, as the strength of the frame 110, and the first and second lead frames 120 and 130 in a cut area is increased, the body in the cut area may be cracked.

The coupling force between the body and the frame 110 and the coupling force between the body and the first and second lead frames 120 and 130 may be improved due to the structure of the first curved part 110a having a width greater than that of the protrusion part 110p. In addition, the frame 110 and the first and second lead frames 120 and 130 having stronger strength may be easily curt due to the structure of the protrusion part 110p having a width narrower than that of the first curved part 110a, thereby preventing a peripheral portion of a cut area from being cracked.

The first lead frame 120 may include the second protrusion parts 120p exposed through the outer portions. The first lead frame 120 may include a second curved part 120a facing the first curved part 110a. The second curved part 120a may protrude toward the frame 110. The second curved part 120a has a seventh width W7 formed in a first direction X-X' toward the first curved part 110a and an eighth width W8 formed in a second direction Y-Y perpendicular to the first direction X-X'.

The seventh width W7 of the second curved part 120a may be greater than the sixth width W6 of the first spacer 175, but the embodiment is not limited thereto. For example, the seventh width W7 of the second curved part 120a may be 1.2 times to 10 times greater than the sixth width W6 of the first spacer 175. The eighth width W8 of the second curved part 120a may be equal to or greater than the sixth width W6 of the first spacer 175, but the embodiment is not limited thereto. For example, the eighth width W8 of the second curved part 120a may be 1 time to 10 times greater than the sixth width W6 of the first spacer 175.

When the seventh and eighth widths W7 and W8 are less than the sixth width W6, the coupling force between the body 170 and the frame 110, and the coupling force between the body and the first and second lead frames 120 and 130 may be reduced, and the first and second spacers 175 and 176 may not be prevented from being cracked by an external force. When the seventh and eighth widths W7 and W8 exceed ten times the sixth width W6, the designing of the light emitting device package may be difficult.

The sixth width W6 may be in the range of 0.2 mm to 0.5 mm, the seventh width W7 may be in the range of 0.24 mm to 2 mm, and the eighth width W8 may be in the range of 0.2 mm to 2 mm. For example, according to the embodiment, the sixth width W6 may be 0.3 mm, the seventh width W7 may be 0.5 mm, and the eighth width W8 may be 0.58 mm.

The second lead frame 130 may include the third protrusion parts 130p exposed through the outer portions. The second lead frame 130 may include a third curved part 130a facing the first curved part 110a. Details of the third curved part 130a may be understood by those skilled in art with reference to the description of the second curved part 120a, and thus has been omitted. As the first and second lead frames 120 and 130 include curved structures at the edges thereof, the coupling force between the body 170 and the first and second lead frames 120 and 130 may be improved, and peripheral portions of the first and second spacers 175 and 176 may be prevented from being cracked.

Figure 11:
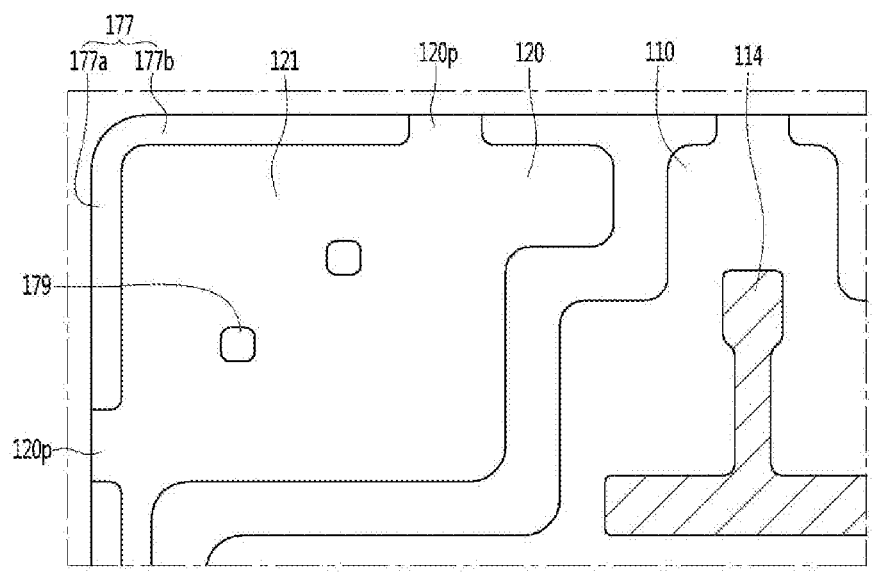
FIG. 11 is a view showing a first pad area according to an embodiment.
Figure 12:
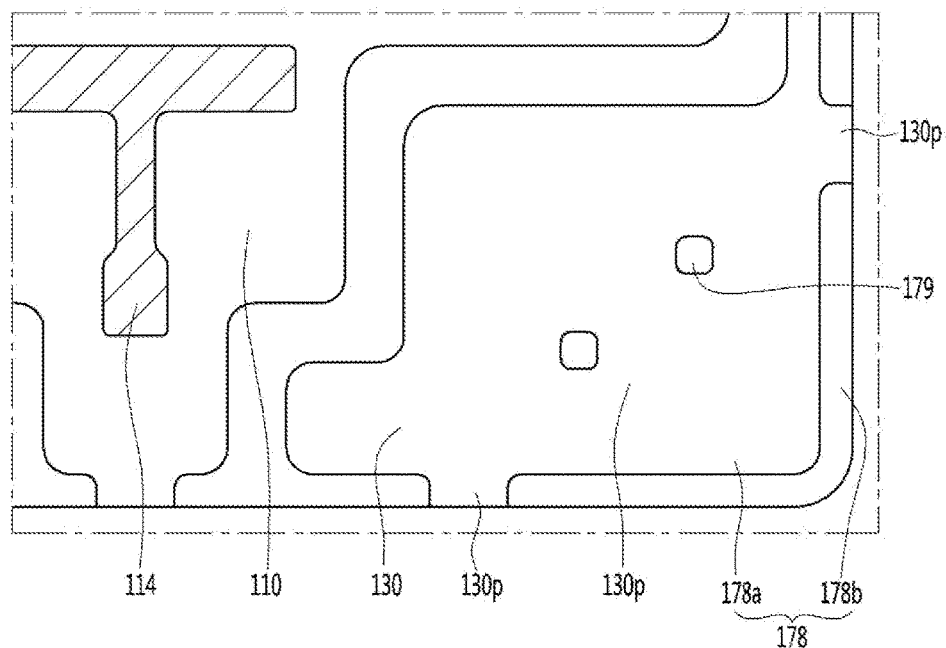
FIG. 12 is a view showing a second pad region according to an embodiment.

As shown in FIG. 1, FIG. 11 and FIG. 12, the light emitting device package 100 may include the first and second pads 121 and 122 provided on first and second edges or corners 170*a* and 170*b* symmetrical to each other. Top surfaces of the first and second pads 121 and 131 may be exposed from the body 170. The first pad 121 may include at least one through hole 179. The through hole 179 may be filled with a portion of the body 170. The through hole 179 may increase the contact area between the first lead frame 120 and the body 170 to improve the coupling force between the body 170 and the first lead frame 120.

The first protective part 177 covering the outer portion of the first pad 121 and a second protective part 178 covering the outer portion of the second pad 131 may be included. The first and second protective parts 177 and 178 may be included in the body 170. The first protective part 177 may be provided at an outer portion of the first pad 121 to directly make contact with the first pad 121, and the second protective part 178 may be provided at an outer portion of the second pad 131 to directly make contact with the second pad 131. The first and second protective parts 177 and 178 may be provided outside the first and second corners 170*a* and 170*b* to protect the first and second pads 121 and 131 from the outside.

The first protective part 177 may be interposed between the second protrusion parts 120*p* extending from the first pad 121. The first protective part 177 may include third and fourth linear parts 177*a* and 177*b*. The third and fourth linear parts 177*a* and 177*b* may directly make contact with the second protrusion parts 120*p*. The third and fourth linear parts 177*a* and 177*b* may be connected with each other. The third and fourth linear parts 177*a* and 177*b* may directly make contact with the outer portion of the first pad 121 exposed between the second protrusion parts 120*p*.

The second protective part 178 may be interposed between the third protrusion parts 130*p* extending from the second pad 131. The second protective part 178 may include fifth and sixth linear parts 178*a* and 178*b*. The fifth and sixth linear parts 178*a* and 178*b* may directly make contact with the third protrusion parts 130*p*. The fifth and sixth linear parts 178*a* and 178*b* may be connected to each other. The fifth and sixth linear parts 178*a* and 178*b* may directly make contact with the outer portions of the second pad 131 exposed between the third projections 130*p*.

The first and second protective parts 177 and 178, which cover the outer portions of the first and second pads 121 and 131, may be included to protect the first and second pads 121 and 131 and to improve the coupling force between the body 170 and the first and second lead frames 120 and 130. At least one through hole 179 may be formed through the first and second pads 121 and 131 to improve the coupling force between the body 170 and the first and second lead frames 120 and 130.

Figure 13:
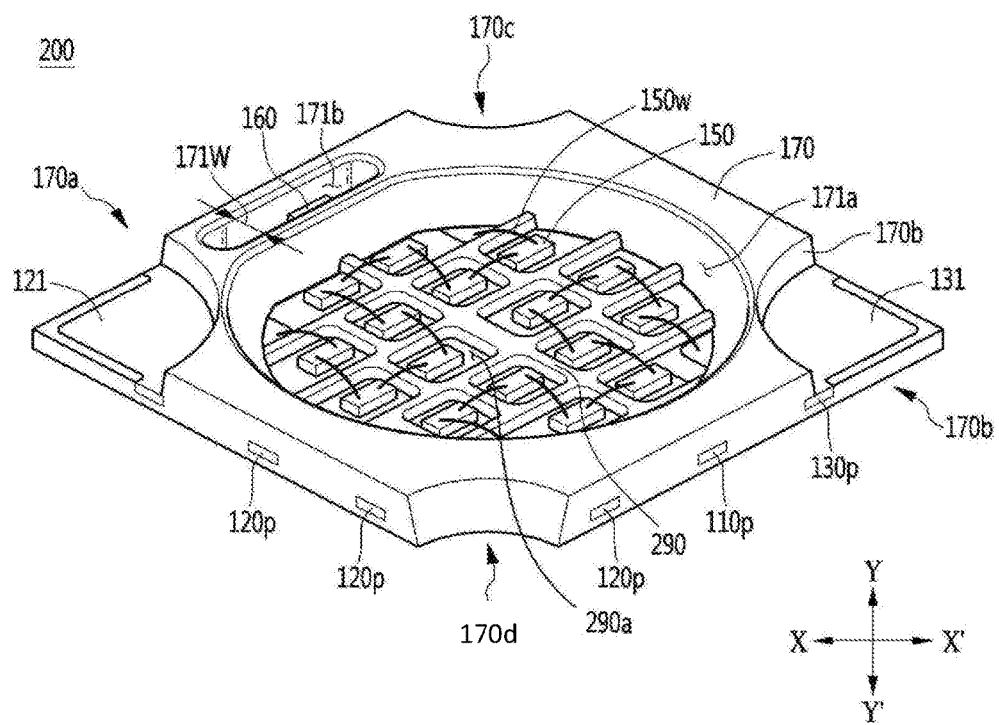
FIG. 13 is a perspective view showing a light emitting device package according to another embodiment.

As shown in FIG. 13, according to another embodiment, a light emitting device package 200 may include a reflective part 290. The light emitting device package 200 may employ technical features of light emitting device package 100 in previous embodiments of FIG. 1 to FIG. 12 except for the reflective part 290.

The body 170 may include the reflective part 290 inside the first cavity 171*a*. The reflective part 290 may include sub-cavities 290*a* individually surrounding the relevant light emitting devices 150. The reflective part 290 may be defined as a part protruding upward from the bottom of the first cavity 171*a*. The reflective part 290 may correspond to the arrangement structure of the light emitting devices 150. For example, the reflective part 290 may be formed in a matrix type, but the embodiment is not limited thereto. The reflective part 290 may include the sub-cavities 290*a* corresponding to the light-emitting devices 150 in number. For example, according to the embodiment, the reflective part 290 may include 16 sub-cavities 290*a* corresponding to 16 light emitting devices 150, but the embodiment is not limited thereto.

The reflective part 290 may have a width which gradually decreases upward. The reflective part 290 may include inclined side surfaces, but is not limited thereto. For example, the reflective part 290 may include sides of a curved structure. Widths of upper and lower portions of the reflective part 290 may employ technical features of the first and second reflective partitions 191 and 193 in the previous embodiments.

The reflective part 290 may have a height lower than that of the inner surface of the first cavity 171*a*, but the embodiment is not limited thereto. For example, the height of the reflective part 290 may be equal to or higher than that of the light emitting device 150. The height of the reflective part 290 may be equal to or lower than the inner surface of the first cavity 171*a*.

The matrix-type reflective part 290 may be included in the COB light emitting device package 200 to reflect light, emitted from the light emitting devices 150, to the outside, thereby improving the light extraction efficiency. Deformation of the light emitting device package 200 resulting from the contraction and expansion of the light emitting device package 200 may be prevented by the matrix-type reflective part 190 provided in the first cavity 171*a* in which the light emitting devices 150 are mounted.

Deformation of a molding part resulting from the contraction and the expansion of the molding part provided in the first cavity 171*a* may be prevented by the matrix-type reflective part 190 provided in the first cavity 171*a* in which the light emitting devices 150 are mounted. The deformation of the molding part may be prevented, thereby preventing the damage to the wire 150W caused by the deformation of the molding part. Light extraction efficiency of the light emitting device package 200 may be improved by refracting light from the light emitting device 150 in various directions.

Figure 14:
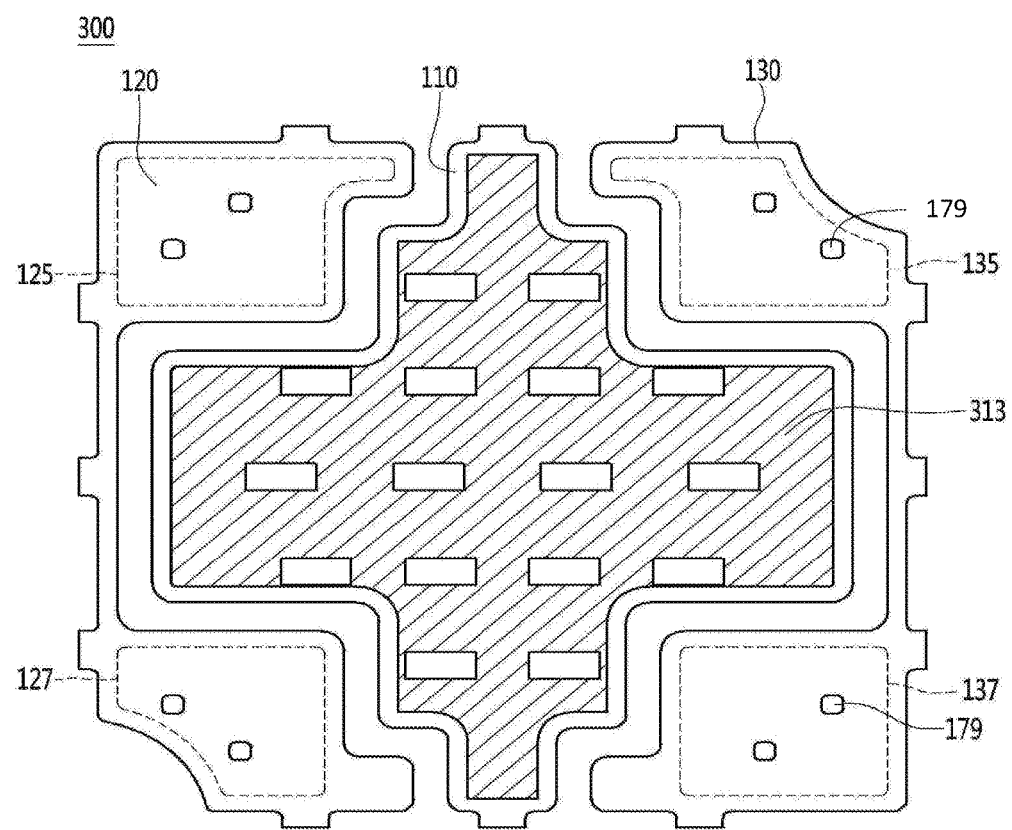
FIG. 14 is a plan view showing a light emitting device package according to still another embodiment.
Figure 15:
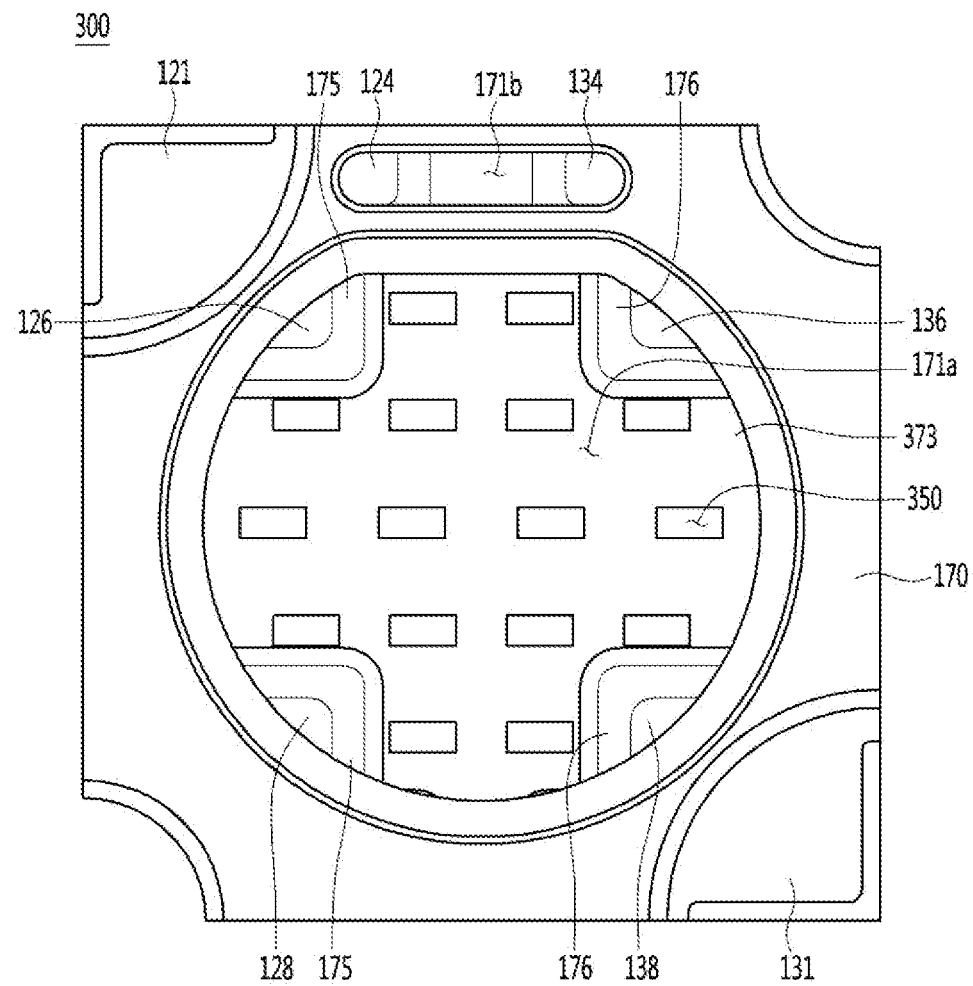
FIG. 15 is a plan view showing a light emitting device package according to the other embodiment of FIG. 14.

As shown in FIG. 14 and FIG. 15, according to still another embodiment, a light emitting device package 300 may include a stepped part 313 and a coupling part 373. The light emitting device package 300 may employ technical features of light emitting device package 100 shown in FIG. 1 to FIG. 12 in previous embodiments except for the stepped part 313 and the coupling part 373.

The frame 110 may include the stepped part 313. The stepped part 313 may be provided on the frame 110. The stepped part 313 may have a recess shape, and may have a stepped structure when viewed a cross-sectional view, but the embodiment is not limited thereto.

The stepped part 313 may increase the contact area with the body 170 to improve the coupling force with the body 170. Further, the stepped part 313 may prevent external moisture from being permeated due to the stepped structure. The stepped part 313 may be formed by etching a portion of the top surface of the frame 110, but the embodiment is not limited thereto. The thickness of the stepped part 313 may be 50% of the thickness of the frame 110, but the embodiment is not limited thereto. For example, the thickness of the stepped part 313 may be 50% or more of the thickness of the frame 110.

The stepped parts 313 may be spaced apart from the frame 110 by a specific distance along the edge of the frame 110. The frame 110 may be provided on the bottom surface thereof with a lower stepped structure formed along the edge of the frame 110. The stepped part 313 may be spaced apart from the frame 110 by the specific distance along the edge of the frame 110 such that the stepped part 313 does not overlap the lower stepped structure, but the embodiment is not limited thereto. For example, when the stepped structure is omitted from the bottom surface of the frame 110, the stepped part 313 may be provided up to the edge of the top surface of the frame 110. The frame 110 may include a plurality of light emitting device mounting parts 350 formed on the top surface.

Thicknesses of the light emitting device mounting parts 350 may correspond to the thickness of the frame 110. As the frame 110 has the stepped part 313 provided at a remaining area of the frame 110 except for the edge of the frame 110 and the light emitting device mounting parts 350, a contact area between the coupling part 373 and the frame 110 may be increased to improve the coupling force between the body 170 and the frame 110.

The stepped part 313 may entirely overlap the coupling part 373 of the body 170 and may make contact with the coupling part 373. The top surface of the coupling part 373 may be aligned in line with top surfaces of the light emitting device mounting parts 350.

As the stepped part 313 is provided in an area except for the light emitting device mounting parts 350, and are coupled to the coupling part 373 of the body 170 to increase the contact area between the body 170 and the frame 110, the coupling force between the body 170 and the frame 110 may be improved, and external moisture may be prevented from being permeated due to the stepped structures.

According to embodiments, the light emitting device package may be applied to a display device, a lighting unit, an indicator, a lamp, a street lamp, a lighting device for a vehicle, a display device for the vehicle, a smart watch, and the like, but the embodiment is not limited thereto.

When the light emitting device package is used for a backlight unit of a display device, the light emitting device package may be used for an edge-type backlight unit or a direct-type backlight unit. When the light emitting device package is used for a light source of a lighting device, the light emitting device package may be used in a lighting device type or a bulb type, or may be used for a light source of a mobile terminal.

A semiconductor device may include a laser diode in addition to a light emitting diode. The semiconductor device may not be implemented with just a semiconductor. The semiconductor device may further include a metallic material. For example, a semiconductor device serving as a light receiving device may be implemented with at least Ag, Al, Au, In, Ga, N, Zn, Se, P, or As, or may be implemented with a semiconductor material doped with P-type dopants or N-type dopants, or an intrinsic semiconductor material.

Embodiments disclosed herein may provide a light emitting device package, capable of improving light extraction efficiency, and a lighting device having the same. Embodiments disclosed herein may provide a light emitting device package, capable of improving coupling force between components, and a lighting device having the light emitting device package. Embodiments disclosed herein may provide a chip-on-board (COB) light emitting device package having a stabile structure and a lighting device having the same.

According to embodiments disclosed herein, the light emitting device package may include a frame, a first lead frame spaced apart from the frame by a specific distance, a second lead frame spaced apart from the frame by the specific distance, a body coupled to the frame and the first and second lead frames and having a first cavity, and a plurality of light emitting devices provided on the frame exposed through the first cavity, in which the body may include a reflective part provided inside the first cavity to surround at least one of the light emitting devices, thereby improving light extraction efficiency.

Deformation of the light emitting device package resulting from the contraction and the expansion of the light emitting device package may be prevented by the reflective part. Deformation of a molding part resulting from the contraction and expansion of the molding part provided in the first cavity can be prevented by the reflective part. The deformation of the molding part can be prevented, thereby preventing the damage to a wire resulting from the deformation of the molding part.

A lighting device may include the light emitting device package. As described above, according to the light emitting device package of the embodiments, the deformation of the light emitting device package resulting from the contraction and the expansion of the light emitting device package may be prevented by the reflective part extending across the central area of the cavity in which the light emitting devices are mounted.

The deformation of the molding part resulting from the contraction and the expansion of the molding part provided in the first cavity may be prevented by the reflective part extending across the central area of the cavity in which the light emitting devices are mounted. The deformation of the molding part can be prevented, thereby preventing the damage to the wire resulting from the deformation of the molding part.

As the stepped part may be provided on the top surface of the heat sinking plate, a coupling force between the heat sinking plate and the body may be improved, and external moisture may be prevented from being permeated due to the stepped structure.

The stepped parts may be provided on the lower portions of the first and second lead frames and supported by a mold frame to prevent the first and second lead frames from being deformed. In addition, reliability of the injection-molding process of the body that exposes the connection parts and the pads from the body through the cavity may be improved. Further, the external moisture may be prevented from being permeated due to the stepped structures formed on the lower portion of the first and second lead frames. Flexible structures may be provided at edges of the first and second lead frames not only to improve the coupling force with the body, but also to prevent a peripheral portion of the spacer, which is provided between the first and second frames, from being cracked.

The protective part, which covers the outer portion of the pad, may be included to protect the pad and to improve the coupling force between the body and the first and second lead frames. In addition, at least one through hole may be formed through the pad to improve the coupling force between the body and the first and second lead frames.

In the previous description of the embodiments, it may be understood that, when each of elements are referred to as being "on" or "under" another element, it can be "directly" or "indirectly" on the element, or one or more intervening element may also be present. In addition, if the element is expressed in association with the terms "on" or "under", the direction of the element includes the lower direction of the element as well as the upper direction of the element.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a frame;
   a first lead frame spaced apart from the frame;
   a second lead frame spaced apart from the frame;
   a body coupled to the frame and the first and second lead frames and having a first cavity; and
   a plurality of light emitting devices provided on the frame exposed through the first cavity,
   wherein the body includes a reflective part provided inside the first cavity to surround at least one of the light emitting devices,
   wherein the reflective part includes:
      a first reflective partition and a second reflective partition that extend from an inner surface of the first cavity, and
      a third reflective partition that extends from a central area of the first reflective partition or the second reflective partition,
   wherein the first and second reflective partitions are spaced apart from each other, and the third reflective partition couples an intermediate point of the first reflective partition to an intermediate point of the second reflective partition,
   wherein the body further includes a first coupling part on the frame exposed through a bottom of the first cavity, and
   wherein the first to third reflective partitions are provided on the first coupling part,
      the first coupling part includes first extension parts and second extension parts,
      first cavity and faces each other, and
      the second extension parts extend from the first extension parts and are spaced apart from each other.

2. The light emitting device package of claim 1, wherein each of the first to third reflective partitions has a width that gradually decreases upward, a lateral side that is inclined or curved, and a height that is equal to or higher than heights of the light emitting devices and equal to or lower than a height of the inner surface.

3. The light emitting device package of claim 1, wherein a distance between the first extension parts is greater than a distance between the first reflective partition and the second reflective partition, and
   wherein a distance between the second extension parts is less than the distance between the first reflective partition and the second reflective partition.

4. The light emitting device package of claim 3, wherein the frame includes a first stepped part and second stepped parts formed thereon and having concave structures,
   wherein the first stepped part overlaps an entire portion of the first coupling part while extending across a central area of the frame, and
   wherein the second stepped parts are symmetrical to each other about the first stepped part while being spaced apart from each other.

5. The light emitting device package of claim 4, wherein each of the second stepped parts includes:
   a first linear part parallel to the first stepped part;
   a second linear part extending from a central area of the first linear part toward an outer portion of the frame; and
   an end portion of the second linear part, and
   wherein a width of the end portion is wider than a width of the second linear part.

6. The light emitting device package of claim 1, further comprising a first spacer, which is provided between the frame and the first lead frame, and a second spacer which is provided between the frame and the second lead frame,
   wherein the frame includes first protrusion parts, which are exposed through an outer portion of the light emitting device package, a mounting part in which the light emitting devices are mounted, and a first curved part extending from the mounting part,
   wherein the first curved part has a width greater than a width of each first protrusion part,
   wherein the first lead frame includes second protrusion parts, which are exposed through an outer portion of the first lead frame, and a second curved part facing the first curved,
   wherein the second lead frame includes third protrusion parts, which are exposed through an outer portion of the second lead frame, and a third curved part facing the first curved, and
   wherein widths of the second and third curved parts, which protrude in a first direction, are greater than widths of the first and second spacers, and widths of the second and third curved parts, which protrude in a second direction perpendicular to the first direction, are equal to or greater than the width of the first and second spacers.

7. The light emitting device package of claim 6, wherein the first and second spacers have curved structures.

8. The light emitting device package of claim 6, wherein each of the widths of the second and third curved parts protruding in the first direction while facing each other is 1.2 times to 10 times of each of the widths of the first and second spacers.

9. The light emitting device package of claim 8, wherein each of the widths of the second and third curved parts, which protrude in the second direction perpendicular to the first direction, is one time to 10 times of each of the widths of the first and second spacers.

10. The light emitting device package of claim 8, wherein each of the widths of a second and third curved parts protruding in the first direction while facing each other is in a range of 0.24 mm to 2 mm.

11. The light emitting device package of claim 8, wherein each of the widths of the second and third curved parts protruding in the second direction perpendicular to the first direction while facing each other is in a range of 0.2 mm to 2 mm.

12. The light emitting device package of claim 8, wherein each of the widths of the first and second spacers is in a range of 0.2 mm to 0.5 mm.

13. The light emitting device package of claim 1, further comprising a first pad and a second pad provided at corners of the first lead frame and the second lead frame, which are symmetrical to each other, respectively,
wherein the first and second pads have upper portions exposed from the body.

14. A light emitting device package comprising:
a frame;
a first lead frame spaced apart from the frame;
a second lead frame spaced apart from the frame;
a body coupled to the frame and the first and second lead frames and having a first cavity; and
a plurality of light emitting devices provided on the frame exposed through the first cavity,
wherein the body includes a reflective part provided inside the first cavity to surround at least one of the light emitting devices,
wherein the body further includes a second cavity spaced apart from the first cavity and a protective device provided on the frame exposed through a bottom of the second cavity,
wherein the first lead frame includes a first connection part and a second connection part, which are exposed through the bottom of the first cavity, and a fifth connection part having an upper portion exposed through the bottom of the second cavity,
wherein the second lead frame includes a third connection part and a fourth connection part, which are exposed through the bottom of the first cavity, and a sixth connection part having an upper portion exposed through the bottom of the second cavity,
wherein the first lead frame includes a third stepped part and a fourth stepped part, which are formed on a lower portion of the first lead frame, and the second lead frame includes a fifth stepped part and a sixth stepped part which are formed on a lower portion of the second lead frame,
wherein portions of the third and fourth stepped parts overlap the first, second, and fifth connection parts, and
wherein the portions of the fifth and sixth stepped parts overlap the third, fourth, sixth connection parts.

15. The light emitting device package of claim 14, further comprising a second pad on the second lead frame, wherein the second pad overlaps the sixth stepped part.

16. A light emitting device package comprising:
a frame;
a first lead frame spaced apart from the frame;
a second lead frame spaced apart from the frame;
a body coupled to the frame and the first and second lead frames and having a first cavity;
a plurality of light emitting devices provided on the frame exposed through the first cavity; and
a first pad and a second pad provided at corners of the first lead frame and the second lead frame, which are symmetrical to each other, respectively,
wherein the body includes a reflective part provided inside the first cavity to surround at least one of the light emitting devices,
wherein the first and second pads have upper portions exposed from the body,
wherein the body further includes a first protective part, which is provided outside the first pad, and a second protective part which provided outside the second pad,
wherein the first protective part includes a third linear part and a fourth linear part connected with each other and directly making contact with an outer portion of the first pad,
wherein the second protective part includes a fifth linear part and a sixth linear part connected with each other and directly making contact with an outer portion of the second pad, and
wherein the first and second pads include at least one through hole.

17. The light emitting device package of claim 14, further comprising a first pad on the first lead frame, wherein the first pad overlaps the third stepped part.

18. The light emitting device package of claim 16, wherein the reflective part includes:
a first reflective partition and a second reflective partition that extend from an inner surface of the first cavity; and
a third reflective partition that extends from a central area of the first reflective partition or the second reflective partition,
wherein the first and second reflective partitions are spaced apart from each other, and the third reflective partition couples an intermediate point of the first reflective partition to an intermediate point of the second reflective partition.

19. The light emitting device package of claim 18, wherein the body further includes a first coupling part on the frame exposed through a bottom of the first cavity, and
wherein the first to third reflective partitions are provided on the first coupling part,
the first coupling part includes first extension parts and second extension parts,
the first extension parts directly makes contact with the inner surface of the first cavity and faces each other, and
the second extension parts extend from the first extension parts and are spaced apart from each other.

20. A lighting device having the light emitting device package of claim 1.

21. A lighting device having the light emitting device package of claim 14.

22. A lighting device having the light emitting device package of claim 16.

* * * * *